(12) United States Patent
Fucsko et al.

(10) Patent No.: US 7,135,381 B2
(45) Date of Patent: Nov. 14, 2006

(54) WET ETCHING METHOD OF REMOVING SILICON FROM A SUBSTRATE AND METHOD OF FORMING TRENCH ISOLATION

(75) Inventors: Janos Fucsko, Boise, ID (US); Grady S. Waldo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/207,115

(22) Filed: Aug. 18, 2005

(65) Prior Publication Data
US 2006/0024914 A1   Feb. 2, 2006

Related U.S. Application Data

(62) Division of application No. 10/625,166, filed on Jul. 22, 2003.

(51) Int. Cl.
*H01L 21/76* (2006.01)

(52) U.S. Cl. ..................... 438/430; 438/753
(58) Field of Classification Search .............. 438/430
See application file for complete search history.

(56) References Cited

U.S. PATENT DOCUMENTS

| 3,434,896 A | * | 3/1969 | Chance ..................... 216/99 |
| 5,099,304 A | * | 3/1992 | Takemura et al. .......... 257/647 |
| 5,155,058 A | | 10/1992 | Fujiwara et al. |
| 5,650,043 A | | 7/1997 | Kaji et al. |
| 6,306,775 B1 | | 10/2001 | Li |
| 6,955,972 B1 | * | 10/2005 | Lee et al. .................. 438/430 |

OTHER PUBLICATIONS

Bertagna et al., *Ionic components dependence of the charge transfer reactions at the silicon / HF solution interface*, 4 J. Solid State Electrochem, 42-51 (1999).

* cited by examiner

*Primary Examiner*—Stephen W. Smoot
(74) *Attorney, Agent, or Firm*—Wells St. John P.S.

(57) ABSTRACT

A wet etching method of removing silicon from a substrate includes depositing a layer comprising silicon in elemental form over a substrate. The layer is exposed to an aqueous liquid etching solution comprising a hydroxide and a fluoride, and having a pH of at least 10, under conditions and for a period of time effective to etch the elemental silicon from the substrate. Wet etching can be employed in methods of forming trench isolation, and in other methods. Other aspects and implementations are contemplated.

31 Claims, 3 Drawing Sheets

WET ETCHING METHOD OF REMOVING SILICON FROM A SUBSTRATE AND METHOD OF FORMING TRENCH ISOLATION

RELATED PATENT DATA

This patent resulted from a divisional application of U.S. patent application Ser. No. 10/625,166, filed Jul. 22, 2003, entitled "Wet Etching Method of Removing Silicon From a Substrate", naming Janos Fucsko and Grady S. Waldo as inventors, the disclosure of which is incorporated by reference.

TECHNICAL FIELD

The invention is related to wet etching methods of removing silicon from a substrate and to methods of forming trench isolation within a semiconductor substrate.

BACKGROUND OF THE INVENTION

Integrated circuitry is typically fabricated on and within semiconductor substrates, for example relative to bulk semiconductor substrates and in semiconductor-on-insulator substrates. One exemplary technique for isolating different areas of circuitry includes the fabrication of trench isolation within the substrate, for example a bulk monocrystalline silicon substrate. For example, trenches are etched within a bulk semiconductor substrate, and thereafter filled with an insulative silicon dioxide material.

Another technique of forming trench isolation initially fills the trenches with polycrystalline silicon. Such might be doped with one or more conductivity enhancing impurities, or might be undoped. Regardless, the deposited polysilicon is typically planarized back and then wet etched to recess it within the respective trenches. Thereafter, an insulative material such as silicon dioxide is deposited to fill the remaining volume of the trenches.

One exemplary technique for wet etching the polysilicon to recess it relative to the trenches is to use an aqueous liquid etching solution, having a pH of about 12.0 to 14.0, comprising tetramethyl ammonium hydroxide. Unfortunately, uniformity in the etch in the amount of polysilicon removed from trench to trench is less than desirable, typically being on the order of a 10% to 30% difference among the trenches, and substantially independent of the location of the trenches on the substrate. Accordingly, the recess etch back using such an etching solution is not very controllable or predictable.

The invention was directed to overcoming problems and issues as described above, although such is in no way so limited. The invention is only limited by the accompanying claims as literally worded, without interpretative or limiting reference to the specification, and in accordance with the doctrine of equivalents.

SUMMARY OF THE INVENTION

The invention includes wet etching methods of removing silicon from a substrate and methods of forming trench isolation within a semiconductor substrate.

In one implementation, a wet etching method of removing silicon from a substrate includes depositing a layer comprising silicon in elemental form over a substrate. The layer is exposed to an aqueous liquid etching solution comprising a hydroxide and a fluoride, and having a pH of at least 10, under conditions and for a period of time effective to etch the elemental silicon from the substrate.

In one implementation, a method of forming trench isolation within a semiconductor substrate includes forming a series of isolation trenches within a semiconductor substrate. Silicon in elemental form is deposited to within the isolation trenches. The silicon is exposed to an aqueous liquid etching solution comprising a hydroxide and a fluoride, and having a pH of at least 10, under conditions and for a period of time effective to etch only some of the silicon from the trenches. After the exposing, an insulative material is deposited to within the isolation trenches over silicon remaining within the trenches.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention is described in a first preferred embodiment in connection with FIGS. 1–7 in a preferred implementation of forming trench isolation regions within a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Although a preferred embodiment is described with reference to forming trench isolation regions, any silicon etching is contemplated, for example etching silicon from vias, silicon from plugs and other blanket or discrete silicon masses and layers.

Figure 1:
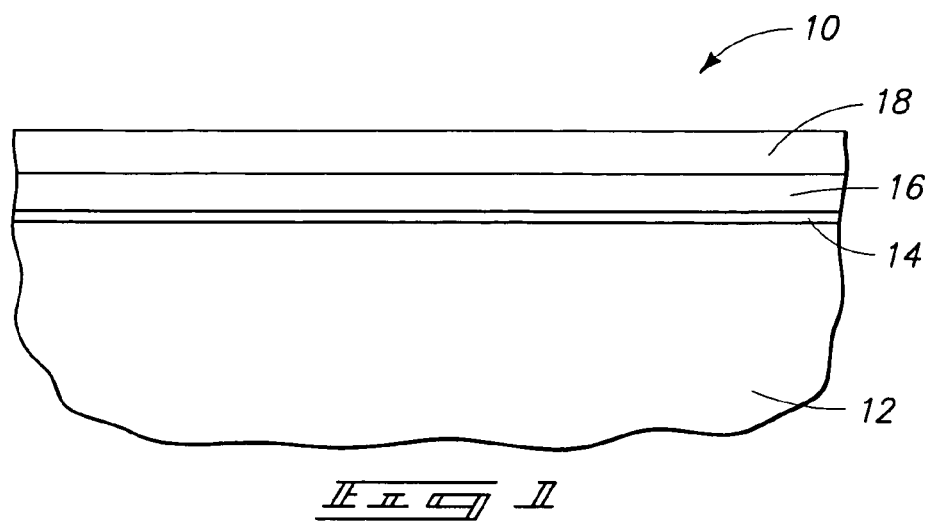
FIG. 1 is a diagrammatic sectional view of a semiconductor wafer fragment in process in accordance with an aspect of the invention.

FIG. 1 depicts a wafer fragment 10 comprised of a bulk monocrystalline silicon substrate 12. Other materials and substrates are of course contemplated, for example semiconductor-on-insulator substrates. A pad oxide layer 14 is formed thereover, and a silicon nitride comprising layer 16 is formed over substrate 14/12. An exemplary thickness range for layer 14 is from 50 Angstroms to 100 Angstroms, while an exemplary thickness range for layer 16 is from 400 Angstroms to 1200 Angstroms. A masking layer 18, for example photoresist, is formed over silicon nitride comprising layer 16. An exemplary thickness for layer 18 is from 2000 Angstroms to 8000 Angstroms.

Figure 2:
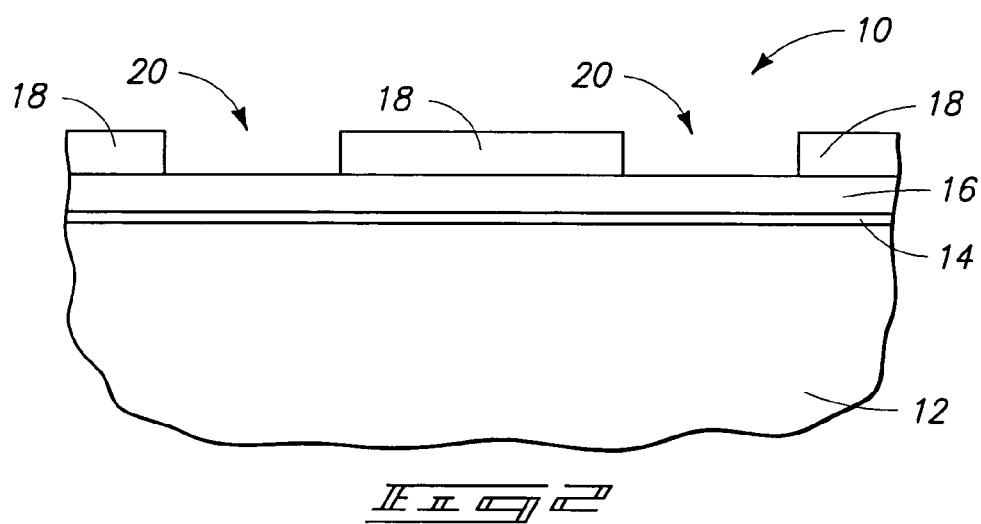
FIG. 2 is a view of the FIG. 1 wafer fragment at a processing step subsequent to that shown by FIG. 1.

Referring to FIG. 2, masking layer 18 has been patterned effective to form a plurality of trench mask openings 20 therethrough to silicon nitride comprising layer 16. Conventional photolithography or other lithographic or non-lithographic methods, whether existing or yet-to-be developed, and regardless of the presence of masking layer 18, are of course also contemplated.

Figure 3:
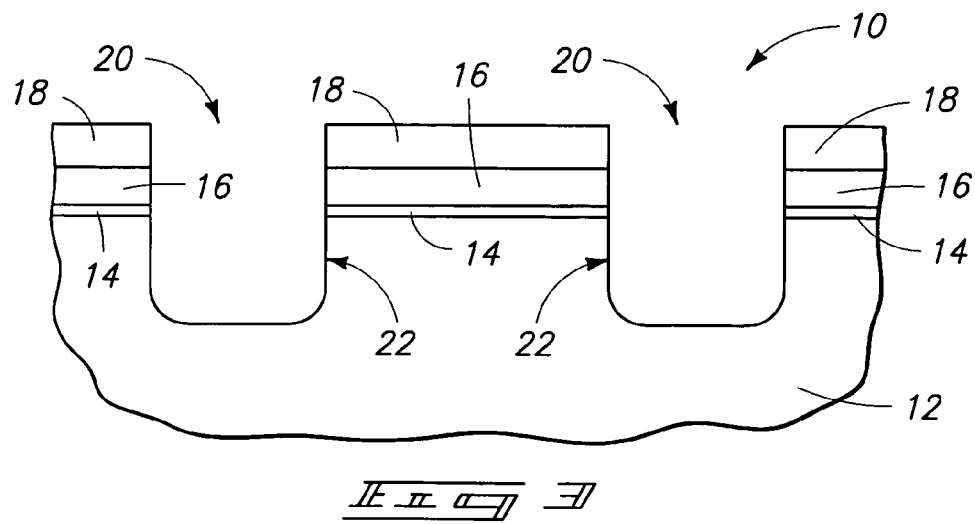
FIG. 3 is a view of the FIG. 2 wafer fragment at a processing step subsequent to that shown by FIG. 2.

Referring to FIG. 3, silicon nitride comprising layer 16, pad oxide layer 14, and substrate material 12 are etched through mask openings 20 effective to form the illustrated isolation trenches 22 within semiconductor substrate 10, and within monocrystalline silicon substrate material 12, in the illustrated preferred embodiments. Such is preferably conducted utilizing a dry anisotropic etching chemistry, with or without plasma, for example comprising ammonia and at least one fluorocarbon. A common chemistry, or different chemistries, might be utilized for etching into/through the respective materials 16, 14 and 12. Masking layer 18 might remain or be removed when etching into substrate material 12.

Such provides but one example of forming a series of isolation trenches 22 within a semiconductor substrate 10. Any method of forming such trenches is contemplated, whether existing or yet-to-be developed, and regardless of the presence of layers 14, 16, 18 or other layers.

Figure 4:
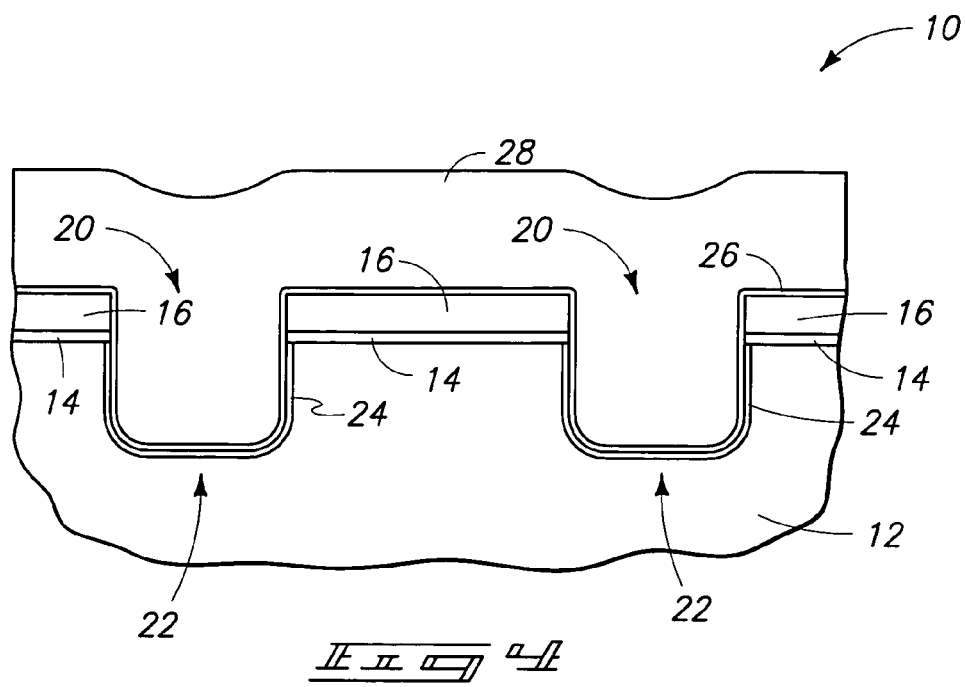
FIG. 4 is a view of the FIG. 3 wafer fragment at a processing step subsequent to that shown by FIG. 3.

Referring to FIG. 4, masking layer 18 has been removed and a thermal oxide layer 24 is grown within trenches 22, and a silicon nitride layer 26 deposited thereover. Exemplary thicknesses for each are about 60 Angstroms. Oxide layer 24 might alternately be formed sometime after deposition of layer 26. Regardless of presence of layers 24 and 26, a layer 28 comprising silicon in elemental form is deposited over substrate 10 to within isolation trenches 22. Layer 28 might be undoped (having essentially no measurable impurity therein), doped with one or more p-type conductivity enhancing impurities, doped with one or more n-type conductivity enhancing impurities, or doped with p and n type conductivity enhancing/modifying impurities. In one preferred implementation, layer 28 consists essentially of silicon in elemental form regardless of the presence of any conductivity modifying impurity. In other words in the context of this document, a preferred layer consisting essentially of silicon in elemental form does not preclude the presence of an effective amount of a conductivity modifying impurity therein, and encompasses such a layer.

In one preferred implementation, layer 28 consists essentially of polycrystalline silicon in elemental form, and in another implementation consists essentially of amorphous silicon in elemental form. Exemplary techniques for forming the same include chemical vapor deposition with or without in situ doping with conductivity modifying impurities. In one implementation, at least a majority of layer 28 comprises polycrystalline silicon. In another implementation, at least a majority of layer 28 comprises amorphous silicon. In yet another implementation, at least a majority of layer 28 comprises monocrystalline silicon. Further, deposition of epitaxial silicon is also of course contemplated. Further, the layer comprising silicon might be doped with one or both of a p-type conductivity enhancing impurity and an n-type conductivity enhancing impurity. Regardless, the above-described FIG. 4 processing depicts but one method of depositing silicon in elemental form to within isolation trenches 22.

Figure 5:
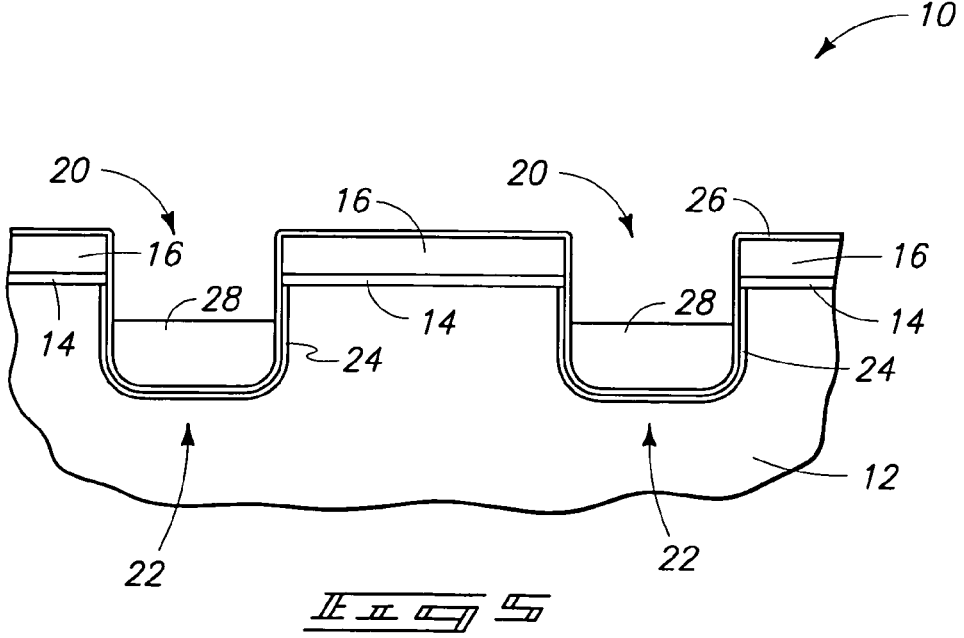
FIG. 5 is a view of the FIG. 4 wafer fragment at a processing step subsequent to that shown by FIG. 4.

Referring to FIG. 5, layer 28 has been planarized back at least to nitride comprising layer 26, for example by chemical mechanical polishing, (CMP) and then exposed to an aqueous liquid etching solution comprising a hydroxide and a fluoride, and having a pH of at least 10, under conditions and for a period of time effective to etch only some of the silicon 28 from trenches 22. Removal techniques other than CMP could of course be utilized. The etching solution might, of course, contain other components such as, by way of example only, surfactants. Preferably, the pH is at least 11.5, and more preferably at least 12.0. Further, the pH is preferably at or below 13.8. The hydroxide can be organic or inorganic, or a combination thereof. Further in one preferred embodiment, the hydroxide comprises an ammonium hydroxide. Exemplary organic hydroxides include any one or more of tetramethyl ammonium hydroxide, tert-butyl ammonium hydroxide, and any other quaternary ammonium hydroxide. Exemplary inorganic hydroxides include ammonium hydroxide and any alkali metal hydroxide, for example potassium hydroxide, sodium hydroxide, etc.

The fluoride can comprise an inorganic fluoride, an electrolyte with an organic cation, or combinations thereof. One exemplary inorganic fluoride includes ammonium fluoride. By way of example only, exemplary electrolytes with organic cations include any one or more of tetramethyl ammonium fluoride, tert-butyl ammonium fluoride and quaternary ammonium fluoride. Other exemplary inorganic fluorides include alkali metal fluorides, for example potassium fluoride, sodium fluoride, lithium fluoride, etc.

In one preferred implementation, the hydroxide comprises an organic hydroxide and the fluoride comprises an inorganic fluoride. In one preferred implementation, the etching solution consists essentially of water, an organic hydroxide, and an inorganic fluoride.

In one preferred implementation, the weight percent of all fluoride in the etching solution is from 0.01% to 5% and the weight percent of all hydroxide in the etching solution is from 0.01% to 25%. One exemplary preferred and reduction-to-practice composition is a weight percent of all fluoride in the etching solution from 0.01% to 0.5% and a weight percent of all hydroxide in the etching solution from 0.01% to 1%. Further, an exemplary specific reduction to practice example is a volumetric ratio of all fluoride to all hydroxide to all water of about 1:5:40 as $NH_4F$ (40% by volume in water):tetramethyl ammonium hydroxide (25% by volume in water):deionized water.

The preferred temperature of the etching conditions include a temperature of from 0° C. to 100° C., with from 20° C. to 35° C. being a more preferred range particularly for etching undoped or n-type silicon. If etching p-type silicon, hydroxide concentration by weight in the etching solution is preferably from 0.5% to 25%, and a preferred etching temperature range is from 60° C. to 110° C. Any ambient pressure is also contemplated, with an exemplary range being from 0.01 atmospheres to 100 atmospheres.

The invention was reduced-to-practice in one implementation where layer 28 consisted essentially of undoped amorphous silicon, and after chemical mechanical polishing layer 28 to the outer portion of layer 26. The etching solution consisted essentially of ammonium fluoride, tetramethyl ammonium hydroxide and water in a volumetric ratio of 1:5:50, and having a pH of from 12.2 to 12.9, under ambient room pressure conditions with an etching solution temperature of 30° C. Such resulted in an amorphous silicon removal rate of about 80 Angstroms per minute, with an expected range being from about 30 Angstroms per minute to about 130 Angstroms per minute. In another reduction-to-practice implementation, layer 28 consisted essentially of undoped annealed polysilicon utilizing the same etching chemistry and temperature-pressure conditions, and resulted in a polysilicon removal rate of from 400 Angstroms per minute to 800 Angstroms per minute. Both such etches were conducted highly selectively relative to the oxide material and nitride material on the substrate. In the context of this document, a selective etch or removal of one material relative to another is defined as a removal rate ratio of at least 2:1. Selective removal rates were achieved of the silicon relative to oxide and nitride in the above examples of greater than 500:1.

In one preferred aspect, fluoride presence in the etching solution is effective under the conditions to achieve increased uniformity in the amount of silicon removal from among the trenches than would otherwise occur under identical conditions for the same period of etching time using an identical etching solution but with the absence of fluoride in the etching solution. For example and by way of example only, etching a substrate under the above exemplary conditions in the absence of fluoride, typically results in a variation of silicon removal from the trenches anywhere from 10% to 30% in an unpredictable manner across the wafer surface. Utilizing a fluoride component in the etch as described above is expected to result in a thickness uniformity difference of from 1% to 5%, with 0.56% RSD (residual standard deviation) occurring in the above exemplary etch of the annealed polysilicon.

The following is provided as a possible theory of operation, with the invention in no way being so limited. The electrochemical corrosion during the etch in the absence of fluoride is believed to possibly have different rates because of different Fermi levels of electrons on the surface being etched. Fluoride ions may increase the Fermi level considerably across the silicon surface being etched, and also decrease the differences between different locations. Also, fluoride ions in the etching solutions might react with the reaction products, making the etch product (typically silica) more soluble, and clear the access route for hydroxide ions to reach the surface.

Figure 6:
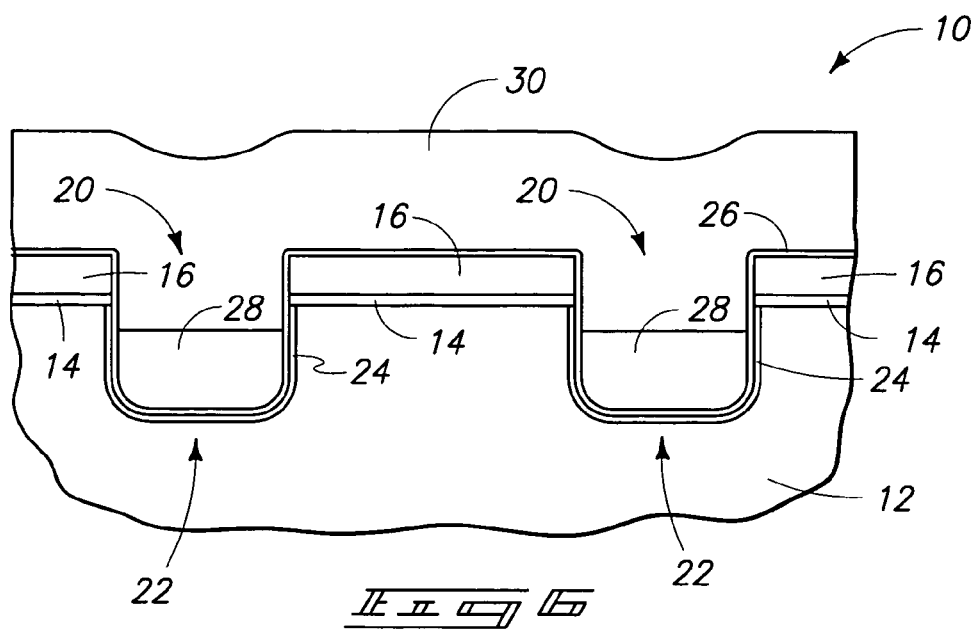
FIG. 6 is a view of the FIG. 5 wafer fragment at a processing step subsequent to that shown by FIG. 5.

Referring to FIG. 6, an insulative material 30 is deposited to within isolation trenches 22 over silicon 28 remaining within trenches 22. An exemplary preferred material is high density plasma deposited silicon dioxide.

Figure 7:
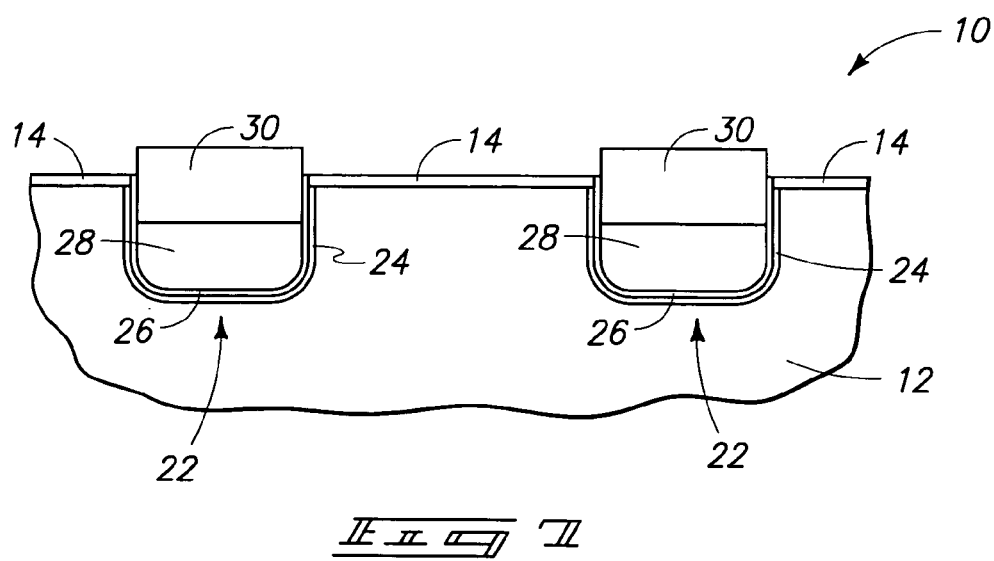
FIG. 7 is a view of the FIG. 6 wafer fragment at a processing step subsequent to that shown by FIG. 6.

Referring to FIG. 7, the substrate has been planarized back to at least nitride 16, for example by chemical mechanical polishing, and then nitride 16 has been wet etched from the substrate, for example using $H_3PO_4$.

Although the invention was described and motivated above with respect to trench isolation fabrication, the invention is in no way so limited. The invention contemplates any wet etching method of removing silicon from the substrate, whether blanketly deposited or appearing on isolated regions, whereby a layer comprising silicon in elemental form is deposited over a substrate. Such layer is then exposed to an aqueous liquid etching solution comprising a hydroxide and a fluoride, and having a pH of at least 10, under conditions effective to etch the elemental silicon from the substrate. Preferred conditions and attributes are otherwise as described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming trench isolation within a semiconductor substrate, comprising:

forming a series of isolation trenches within a semiconductor substrate;

depositing silicon in elemental form to within the isolation trenches;

exposing the silicon to an aqueous liquid etching solution comprising a hydroxide and a fluoride, and having a pH of at least 10, under conditions and for a period of time effective to etch only some of the silicon from the trenches; and after the exposing, depositing an insulative material to within the isolation trenches over silicon remaining within the trenches.

2. The method of claim 1 wherein fluoride presence in the etching solution is effective under the conditions to achieve increased uniformity in amount of silicon removal from among the trenches than would otherwise occur under identical conditions for the period of time using an identical etching solution but with absence of fluoride in the etching solution.

3. The method of claim 1 wherein the pH is at least 11.5.

4. The method of claim 1 wherein the pH is at least 12.0.

5. The method of claim 1 wherein the pH is no greater than 13.8.

6. The method of claim 1 wherein the weight percent of all fluoride in the etching solution is from 0.01% to 5% and the weight percent of all hydroxide in the etching solution is from 0.01% to 25%.

7. The method of claim 6 wherein the weight percent of all fluoride in the etching solution is from 0.01% to 0.5% and the weight percent of all hydroxide in the etching solution is from 0.01% to 1%.

8. The method of claim 1 wherein the hydroxide comprises an ammonium hydroxide, the volumetric ratio of all fluoride to all hydroxide to all water is about 1:5:40 as $NH_4F$ (40% by volume in water):ammonium hydroxide (25% by volume in water):deionized water.

9. The method of claim 1 wherein the hydroxide comprises an ammonium hydroxide.

10. The method of claim 1 wherein the hydroxide comprises an organic hydroxide.

11. The method of claim 10 wherein the organic hydroxide comprises any one or more of tetramethyl ammonium hydroxide, tert-butyl ammonium hydroxide, and quaternary ammonium hydroxide.

12. The method of claim 1 wherein the hydroxide comprises an inorganic hydroxide.

13. The method of claim 12 wherein the inorganic hydroxide comprises an alkali metal hydroxide.

14. The method of claim 1 wherein the fluoride comprises an inorganic fluoride.

15. The method of claim 14 wherein the inorganic fluoride comprises an alkali metal fluoride.

16. The method of claim 14 wherein the inorganic fluoride comprises ammonium fluoride.

17. The method of claim 1 wherein the fluoride comprises an electrolyte with an organic cation.

18. The method of claim 17 wherein the electrolyte with the organic cation is derived from any one or more of tetramethyl ammonium fluoride, tert-butyl ammonium fluoride, and another quaternary ammonium fluoride.

19. The method of claim 1 wherein the hydroxide comprises an organic hydroxide and the fluoride comprises an inorganic fluoride.

20. The method of claim 1 wherein the etching solution consists essentially of water, an organic hydroxide and an inorganic fluoride.

21. The method of claim 1 wherein said depositing is of material consisting essentially of silicon in elemental form.

22. The method of claim 1 wherein at least a majority of the deposited silicon comprises polycrystalline silicon.

23. The method of claim 1 wherein at least a majority of the deposited silicon comprises amorphous silicon.

24. The method of claim 1 wherein at least a majority of the deposited silicon comprises monocrystalline silicon.

25. The method of claim 1 wherein the deposited silicon consists essentially of polycrystalline silicon in elemental form.

26. The method of claim 1 wherein the deposited silicon consists essentially of amorphous silicon in elemental form.

27. The method of claim 1 wherein the deposited silicon is undoped with any p-type and n-type conductivity enhancing impurity.

28. The method of claim 1 wherein the deposited silicon is doped with at least one of p-type and n-type conductivity enhancing impurity.

29. The method of claim 28 wherein the conductivity enhancing impurity is n-type.

30. The method of claim 28 wherein the conductivity enhancing impurity is p-type.

31. The method of claim 1 wherein the trenches are formed in bulk semiconductor material.

* * * * *